April 10, 1962 J. S. LAMMING 3,029,170

PRODUCTION OF SEMI-CONDUCTOR BODIES

Filed Aug. 30, 1956

INVENTOR
JACK STEWART LAMMING
BY Kirschstein, Kirschstein & Ottinger
ATTORNEYS 3,029,170
Patented Apr. 10, 1962

3,029,170

PRODUCTION OF SEMI-CONDUCTOR BODIES

Jack Stewart Lamming, Watford, England, assignor to The General Electric Company Limited, London, England Filed Aug. 30, 1956, Ser. No. 607,200
Claims priority, application Great Britain Sept. 2, 1955
1 Claim. (Cl. 148—1.5)

This invention relates to the production of semiconductor bodies.

In the manufacture of semiconductor devices it is often required to provide a semiconductor body containing a thin internal layer having conduction characteristics different from those of the semiconductor on either side of the layer.

It is an object of the present invention to provide a convenient method of producing such a body.

According to the invention, a method of producing a semiconductor body includes the steps of preparing a solid body of a semiconductor containing at least one donor impurity which is present in appreciably different concentrations (one of which may be zero) in two contiguous regions of the body and at least one acceptor impurity which is present in appreciably different concentrations (one of which may be zero) in said two regions, and subjecting the body to a heat treatment such that diffusion of at least one of the impurities takes place in the semiconductor to an extent such as to establish a layer adjacent the original boundary between said two regions in which the difference between the total donor impurity concentration and the total acceptor impurity concentration has a value appreciably different from the values originally prevailing in said two regions.

One arrangement in accordance with the invention will now be described by way of example with reference to the accompanying diagrammatic drawings in which.

Figures 1, 2, 3, 4, 5:
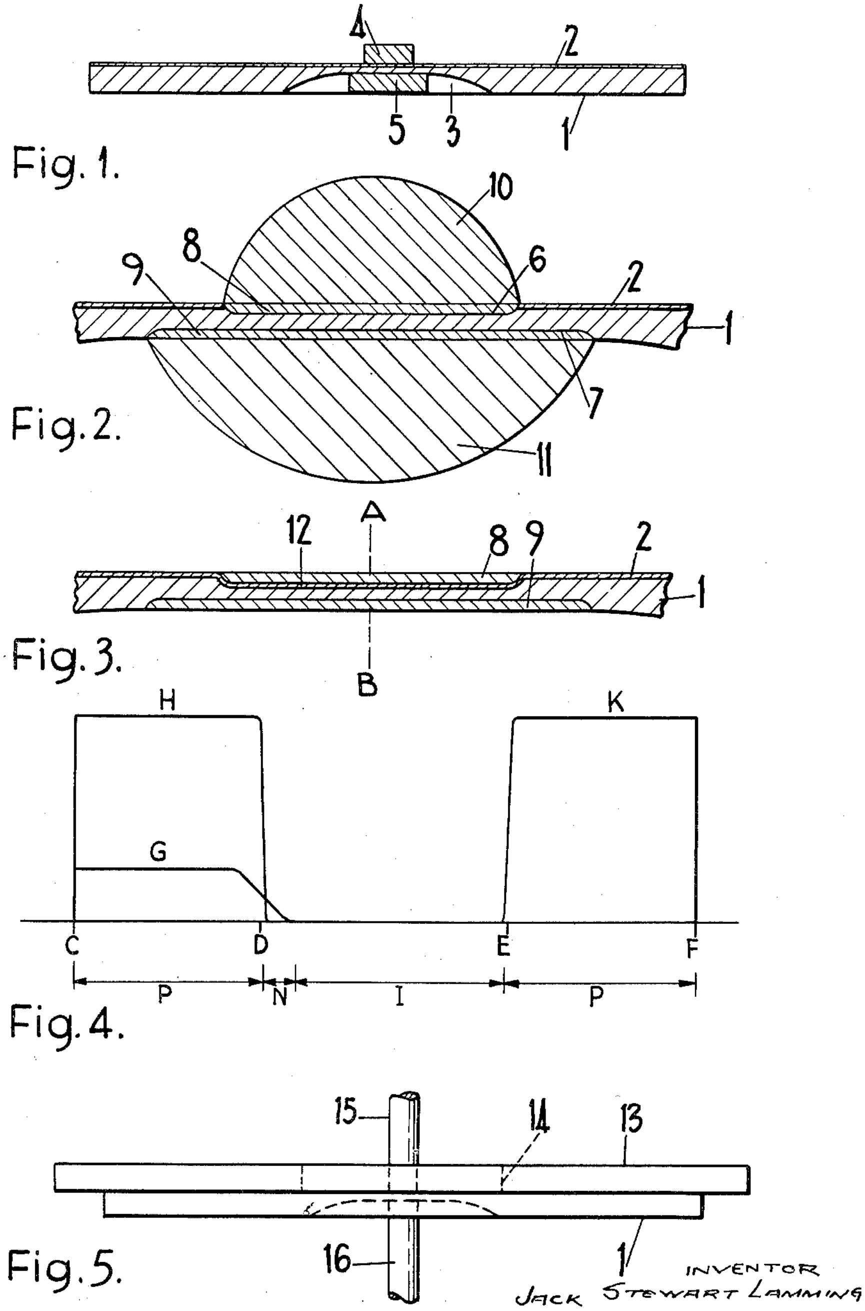
FIGURE 1 is a sectional view of an assembly formed in the initial stages of manufacture of a P-N-I-P transistor.
FIGURE 2 is an enlarged sectional view of part of a structure produced from the assembly shown in FIGURE 1.
FIGURE 3 is a corresponding sectional view of this structure after further stages in the manufacture.
FIGURE 4 is an explanatory diagram relating to the structure shown in FIGURE 3.
FIGURE 5 is an elevation of part of the completed transistor.

Referring to FIGURE 1, the manufacture starts with a thin wafer 1 of substantially pure germanium, having substantially intrinsic conduction characteristics. On one main face of the wafer 1 there is formed a thin N-type surface layer 2 of low resistivity, for example by diffusion into the wafer 1 of a suitable donor impurity such as antimony, and on the other side of the wafer 1 there is formed a centrally disposed pit 3, for example by the known process of electrolytic jet etching. Cylindrical indium alloy pellets 4 and 5 are bonded to the wafer 1, being respectively disposed centrally on the surface layer 2 and on the base of the pit 3; the pellet 4 consists by weight of 99.2% indium, 0.5% gallium and 0.3% antimony, while the pellet 5 consists by weight of 99.5% indium and 0.5% gallium.

The assembly shown in FIGURE 1 is disposed in a suitable jig (not shown) and is heated in an atmosphere of dry hydrogen to a temperature of the order of 500° C., at a rate of the order of 100° C. per second, and is then allowed to cool to room temperature at a rate of the order of 40° C. per second. Referring to FIGURE 2, during the heating the pellets 4 and 5 are melted, the molten materials dissolving parts of the wafer 1 so as to form shallow pits 6 and 7 respectively extending into the wafer 1. The exact heating and cooling cycle is chosen in relation to the relevant dimensions of the assembly so that the pit 6 penetrates through the N-type surface layer 2 so that its base is formed on the pure germanium, and so that the base of the pit 6 is spaced a predetermined small distance apart from the base of the pit 7. During the cooling the molten material on each side of the wafer 1 resolidifies, the initial solidification being such that layers 8 and 9 of germanium recrystallise respectively in the pits 6 and 7, the remainder of the molten material solidifying in the form of beads 10 and 11 which are mainly composed respectively of the original materials of the pellets 4 and 5. The germanium layer 8 contains indium, gallium and antimony, the total concentration of indium and gallium being appreciably greater than that of antimony, and the layer 8 therefore being of P-type conductivity, while the germanium layer 9 contains indium and gallium and is therefore also of P-type conductivity.

The structure shown in FIGURE 2 is then treated with Villela's Reagent (which consists of ethyl alcohol, concentrated hydrochloric acid, and picric acid in the propotrions of 100 cc. of ethyl alcohol to 5 cc. of hydrochloric acid to 1 gram of picric acid), to dissolve away the beads 10 and 11. The wafer 1 is then heated in an atmosphere of dry hydrogen at a temperture of about 800° C., so that diffusion of the antimony, gallium and indium occurs from the layers 8 and 9 into the pure germanium. The diffusion coefficients of antimony, gallium and indium in germanium at 800° C. are respectively $2.5\times10^{-11}$, $1.0\times10^{-13}$ and $2.3\times10^{-13}$ cm.$^2$/second; comparatively little diffusion of indium and gallium will therefore take place from the layers 8 and 9, but appreciable diffusion of antimony will take place from the layer 8. Referring to FIGURE 3, as the antimony diffuses into the pure germanium it establishes a thin layer 12 of N-type conductivity adjacent the original boundary between the layer 8 and the pure germanium, the layer 12 joining up with the N-type surface layer 2 at the periphery of the layer 8. The wafer 1 is maintained at 800° C. for a time sufficient to establish a desired thickness of the layer 12, and is then cooled slowly (for example at about 1° C. per minute) to 500° C., and thereafter more rapidly to room temperature. The slow cooling at temperatures above 500° C. is necessary to avoid quenching in of thermal defects which act as acceptors and which might deleteriously affect the properties of some part of the germanium.

In FIGURE 4 of the drawings is shown a diagram illustrating the final distribution of donor and acceptor impurities along the line AB in FIGURE 3; in this diagram the abscissae represent distances along the line AB while the ordinates represent concentrations of either type of impurity. The points C and F represent the external boundaries of the wafer 1, while the points D and E represent respectively the original internal boundaries of the layers 8 and 9. The line G indicates the donor impurity (antimony) concentration, while the lines H and K indicate the total acceptor impurity (gallium and indium) concentration. The resultant conduction characteristics of various regions of the germanium are indicated by the letters at the bottom of the diagram.

Turning now to FIGURE 5, in the completed transistor the face of the wafer 1 on which the layer 2 is formed is soldered to a nickel plate 13 in which is formed a circular aperture 14 of greater diameter than the layer 8. Electrical connection is made to the layers 8 and 9 by means of fine tungsten wires 15 and 16 whose ends bear respectively on the layers 8 and 9; the contacts between the wires 15 and 16 and the layers 8 and 9 are substantially non-rectifying because of the high impurity content of the layers 8 and 9. The structure illustrated in FIGURE 5 is mounted in a suitable protective envelope (not shown), the plate 13 and the wires 15 and 16 being respectively secured to lead wires (not shown) sealed through the envelope so as to be electrically insulated from each other. In operation of the transistor the plate 13 acts as the base electrode, and the wires 15 and 16 act respectively as the emitter electrode and the collector electrode.

Suitable dimensions envisaged in one specific design of transistor manufactured as described above are as follows:

Wafer 1—3 millimetres square, 0.125 millimetre thick;
Layer 2—5 microns thick;
Pit 3—1 millimetre diameter; 0.1 millimetre deep;
Layer 8—0.3 millimetre diameter, 7.5 microns thick;
Layer 9—0.45 millimetre diameter, 7.5 microns thick;
Layer 12—1 micron thick;
Aperture 14—1 millimetre diameter;
Wires 15 and 16—0.15 millimetre diameter.

For the thickness of the layer 12 quoted above, the heat treatment of the wafer 1 involves maintaining it at 800° C. for about 15 minutes.

While in the specific arrangement described above the semiconductor body produced in accordance with the invention is used to fabricate a single semiconductor device, it is contemplated that in alternative arrangements a relatively large semiconductor body produced in accordance with the invention could be divided into a number of similar small bodies, each suitable for the fabrication of a single device.

I claim:

In a method of producing a semiconductor body, that improvement comprising the successive steps of:

heating an initial solid body of a semiconductor in contact with an alloying material to a first temperature such that the alloying material alloys with a portion of the initial semiconductor body to form a molten alloy in contact with a further portion of the initial semiconductor body, said alloying material consisting essentially of at least one element wihch acts in the semiconductor as a donor impurity and at least one element which acts in the semiconductor as an acceptor impurity;

cooling the system thereby produced to form (*a*) a solid recrystallized mass of the semiconductor deposited from the molten alloy and integrally united with said further portion of the initial body and (*b*) a solid mass consisting principally of the original alloying material and united to said recrystallized mass, said recrystallized mass containing both donor and acceptor impurities derived from said molten alloy and present in such amounts that both the total donor impurity concentration and the total acceptor impurity concentration in said recrystallized mass are appreciably greater than both the total donor impurity concentration and the total acceptor impurity concentration in a region of said further portion of the initial body which is contiguous with said recrystallized mass, the impurity concentration of one type in said recrystallized mass being primarily due to the presence of at least one impurity which diffuses relatively rapidly in the solid semiconductor within a predetermined temperature range whose lower limit is considerably above said first temperature and whose upper limit is below the melting temperature of the semiconductor body, and the impurity concentration of the other type in said recrystallized mass being primarily due to the presence of at least one impurity which diffuses relatively slowly in the solid semiconductor within said temperature range;

removing said mass of the alloying material from the semiconductor;

and then heating the resultant semiconductor body to maintain it in said temperature range for a time sufficient to allow appreciable diffusion of said at least one impurity of said one type to occur from said recrystallized mass to said region contiguous with the recrystallized mass.

References Cited in the file of this patent

UNITED STATES PATENTS

| | | |
|---|---|---|
| 2,701,326 | Pfann et al. | Feb. 1, 1955 |
| 2,725,315 | Fuller | Nov. 29, 1955 |
| 2,784,121 | Fuller | Mar. 5, 1957 |
| 2,836,521 | Longini | May 27, 1958 |
| 2,840,497 | Longini | June 24, 1958 |
| 2,861,018 | Fuller et al. | Nov. 18, 1958 |
| 2,868,683 | Jochems et al. | Jan. 13, 1959 |
| 2,883,313 | Pankove | Apr. 21, 1959 |

FOREIGN PATENTS

| | | |
|---|---|---|
| 1,103,544 | France | May 25, 1955 |
| 1,113,385 | France | Dec. 5, 1955 |
| 751,408 | Great Britain | June 27, 1956 |